United States Patent [19]
Melton et al.

[11] Patent Number: 5,597,110
[45] Date of Patent: Jan. 28, 1997

[54] METHOD FOR FORMING A SOLDER BUMP BY SOLDER-JETTING OR THE LIKE

[75] Inventors: Cynthia M. Melton, Bolingbrook; Robert Pfahl, Glen Ellyn, both of Ill.

[73] Assignee: Motorola, Inc., Schaumburg, Ill.

[21] Appl. No.: 519,439

[22] Filed: Aug. 25, 1995

[51] Int. Cl.$^6$ .............................. B23K 1/20; B23K 1/00
[52] U.S. Cl. .......................... 228/203; 228/254; 228/256
[58] Field of Search .................................... 228/208, 254, 228/256, 203

[56] References Cited

U.S. PATENT DOCUMENTS

| | | | |
|---|---|---|---|
| 2,512,743 | 6/1950 | Hansell . | |
| 3,461,462 | 8/1969 | Ruggiero | 228/208 |
| 4,828,886 | 5/1989 | Hieber | 427/422 |
| 5,269,453 | 12/1993 | Melton et al. | 228/254 |
| 5,477,419 | 12/1995 | Goodman et al. | 228/254 |

FOREIGN PATENT DOCUMENTS

| | | | |
|---|---|---|---|
| 2906802 | 10/1980 | Germany | 228/203 |
| 6-252536 | 9/1994 | Japan | 228/208 |

OTHER PUBLICATIONS

"Micro Dynamic Solder Pump: Drop On Demand Eutectic SnPb Solder Dispensing Device", IBM Personal Computer Company, by Tom Schiesser, Ed Menard, Ted Smith, and Jim Akin. (Date not known).

Journal of Electronic Packaging, vol. 111, "Automated Electronic Circuit Manufacturing Using Ink–Jet Technology", D. B. Wallace (Jun., 1989).

"Society of Manufacturing Engineers, Technical Paper AD87–539, :Application of Ink Jet Technology to Adhesive Dispensing", David B. Wallace and Donald J. Hayes (1987).

ISHM '89 Proceedings, "Application of Ink Jet Technology to Microelectronic Packaging", Donald J. Hayes and David B. Wallace (1989).

*Primary Examiner*—P. Austin Bradley
*Assistant Examiner*—Jeffrey T. Knapp
*Attorney, Agent, or Firm*—Douglas D. Fekete

[57] ABSTRACT

The present invention provides a method for forming a solder bump (24) on a substrate (20). The substrate (20) includes a bond pad (18) having a faying surface (19) composed of solder-wettable metal. The method includes coating the faying surface (19) with a plate (16) formed of a first metal having a first melting temperature, and projecting a discrete microdroplet (14) onto the plate (16). The microdroplet (14) is formed of a molten second metal and has a second melting temperature greater than the first melting temperature. The microdroplet (14) fuses to the plate (16) to form the solder bump (24).

22 Claims, 1 Drawing Sheet

METHOD FOR FORMING A SOLDER BUMP BY SOLDER-JETTING OR THE LIKE

FIELD OF THE INVENTION

This invention relates generally to a method for forming a solder bump by projecting a discrete microdroplet onto a bond pad by solder-jetting or the like. More particularly, this invention relates to such method wherein the bond pad is coated with a low temperature plate and the microdroplet fuses to the plate to form the solder bump.

BACKGROUND OF THE INVENTION

In the manufacture of microelectronic devices, it has been proposed to deposit solder onto a bond pad by solder-jetting. Solder-jetting comprises projecting a discrete microdroplet from a solder-jet nozzle onto the bond pad, usually composed of copper. As used herein, discrete microdroplet refers to a single microdroplet, typically 25 to 50 µm diameter, that is individually formed and projected onto the bond pad. This differs from techniques, such as thermal spraying, that deposit a plurality of microdroplets concurrently onto the bond pad to fuse the microdroplets into an integral layer. The solder bump is attached to the bond pad and is subsequently reflowed in contact with a lead of an electrical component to bond the component to the substrate and electrically connect the component to the bond pad.

One problem with current solder application techniques is poor bonding between the microdroplet and the faying surface of the bond pad. This is attributed to premature solidification of the microdroplet prior to copper-tin intermetallic formations, which wet the copper surface. This wetting is essential in forming a strong metallurgical bond. This in turn is attributed to cooling of the solder microdroplet during flight and by the bond pad upon impact. The problem is magnified in solder-jetting applications due to the small size of solder microdroplets. As a result, the solder bumps tend to spall off the bond pads prior to making the desired connection to the electrical component. Without proper solder connections at the bond pads, electrical connections between electronic components cannot be made, thereby rendering the product being manufactured inoperable.

Therefore, a need exists for a method for depositing, by solder-jetting or the like, microdroplets onto a copper faying surface to improve adhesion of a solder bump. Also, a need exists to provide a reliable source of solder for forming subsequent electrical and mechanical connections to electronic components mounted onto a substrate.

DETAILED DESCRIPTION OF A PREFERRED EMBODIMENT

The present invention comprises a method for forming a solder bump on a substrate by depositing discrete molten microdroplets. The substrate comprises a bond pad having a faying surface composed of copper or other solder-wettable metal. In accordance with this invention, the method includes pre-coating the faying surface with an indium, indium-base alloy, or tin-bismuth alloy plate. When a molten microdroplet is deposited, it fuses to the plate and forms a solder bump tightly bonded to the bond pad. The solder bump is reliably bonded to the bond pad and does not tend to spall, which would lead to an unreliable connection. Consequently, the presence of a reliable solder bump allows for further manufacture of a reliable solder joint when making electrical connections between components on a circuit board.

Figure 1:
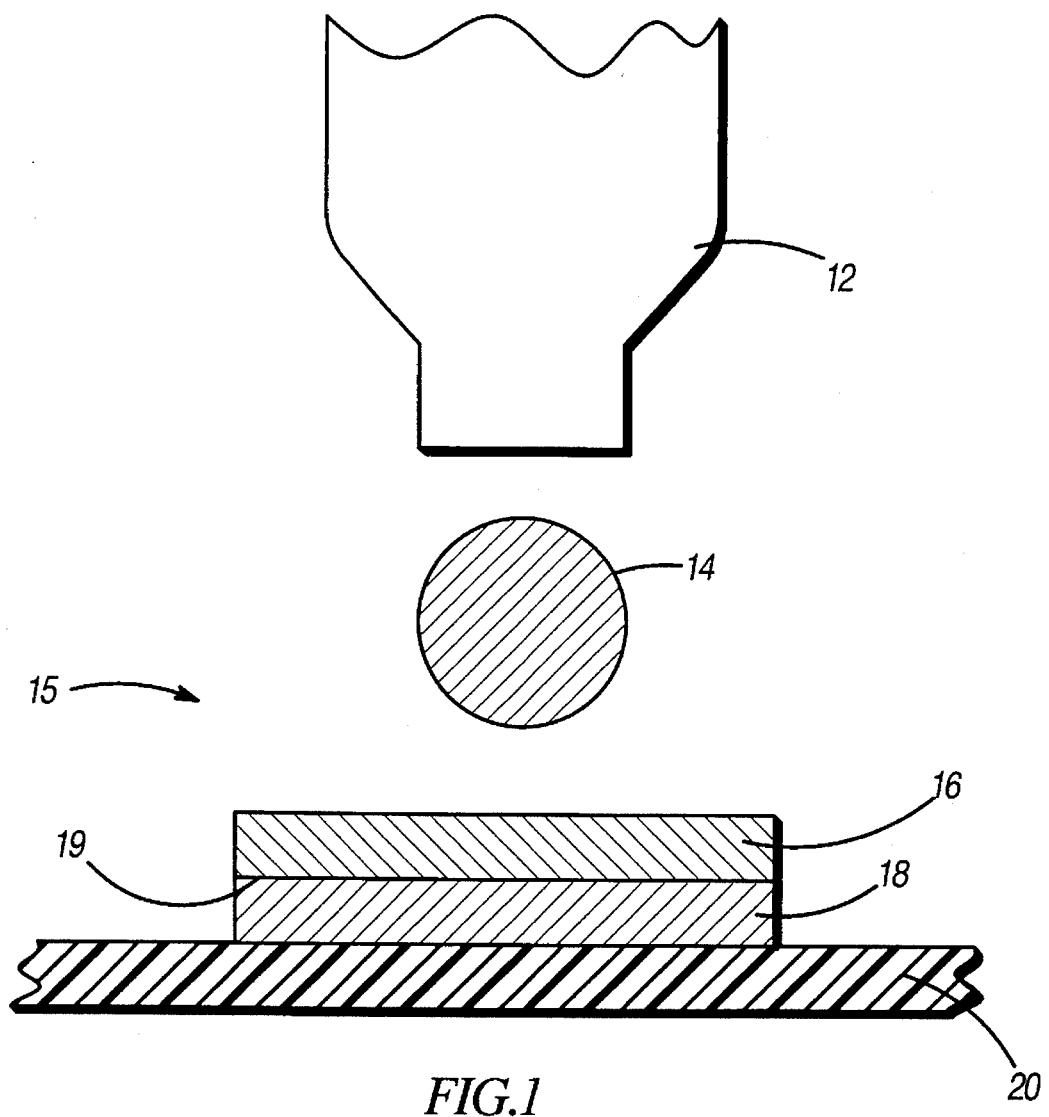
FIG. 1 is a cross-sectional view of a substrate having a bond pad adapted for forming a solder bump in accordance with a preferred embodiment of the present invention.
Figure 2:
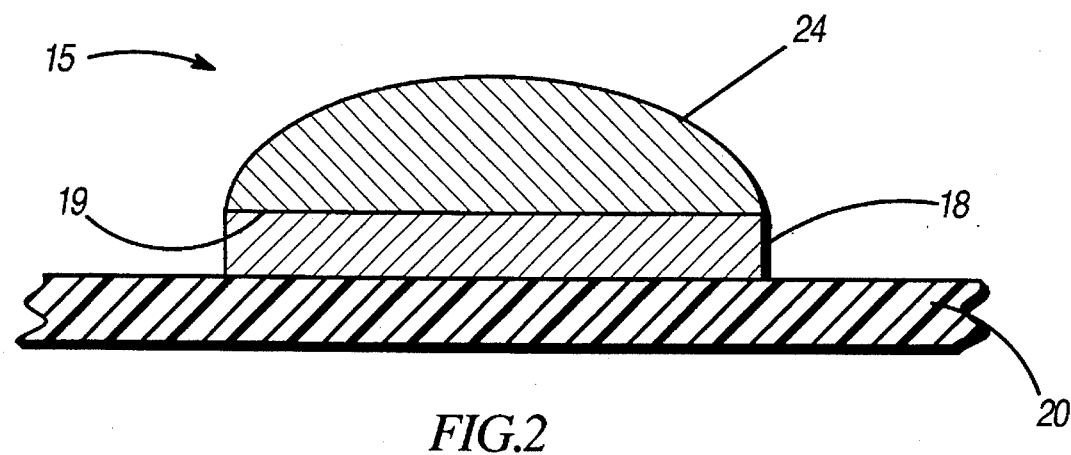
FIG. 2 is a cross-sectional view of the substrate depicted in FIG. 1 comprising a solder bump formed on the bond pad in accordance with the present invention.

A preferred embodiment of the present invention can be better understood with reference to FIGS. 1 and 2. FIG. 1 shows a microdroplet of solder projected from a solder-jetting nozzle 12 of a solder-jet device onto a substrate assembly 15. The solder-jet device is electrically actuated to project a discrete molten solder microdroplet 14 through air toward substrate assembly 15. The solder-jet device produces a molten solder microdroplet 14 having a preferred diameter of 25 to 50 µm. A suitable solder-jet device employs a piezoelectric transducer as a pressure generator from a delivery nozzle, as shown in U.S. Pat. No. 4,828,886, issued to Hieber on May 9, 1989, herein incorporated by reference.

Microdroplet 14 is composed of a tin- or lead-base metal that alloys with plate 16 to produce solder. By way of a specific example, microdroplet 14 is formed of a molten eutectic tin-lead solder having a composition of about 63 weight percent tin and the balance substantially lead and having a melting temperature of about 183° C. Generally, microdroplet 14 can be formed of a molten tin-base solder having a composition of between about 55 and 65 weight percent tin and the balance substantially lead and having a melting temperature greater than about 180° C. Alternately, microdroplet 14 is formed of a molten lead-base solder having a composition of about 95 weight percent lead and the balance substantially tin and having a melting temperature of about 280° C.

Substrate assembly 15 comprises a substrate 20 having a bond pad 18 affixed thereto. Substrate 20 is preferably an FR-board, but could alternately be formed of ceramic, silicon, glass-filled epoxy resin, arimid, or polyimide. Alternately, substrate 20 could be formed of an integrated circuit die or a flexible substrate. Bond pad 18 is preferably composed of copper and includes a faying surface 19, located opposite substrate 20. In accordance with the present invention, plate 16 is coated onto faying surface 19 of bond pad 18 prior to deposition of microdroplet 14. Coating faying surface 19 with plate 16 prevents oxidation of faying surface 19 and therefore removes the need for flux. This decreases the amount of processing necessary to obtain a reliable solder connection, thereby allowing circuit boards to be manufactured in less time and with less material expenditure than in present assemblies.

By way of a specific example of a preferred embodiment, plate 16 is composed of a eutectic tin-indium alloy having a composition of about 50 weight percent tin and the balance substantially indium and having a melting temperature of less than about 120° C. Generally, plate 16 is formed of a tin-indium alloy having a composition between about 15 and 60 weight percent tin and the balance substantially indium and having a melting temperature of less than about 160° C.

In a preferred embodiment, plate 16 is coated on bond pad 18 through electroplating. This is accomplished by immersing the substrate in a plating solution containing tin ions and bismuth ions, wherein the bond pads are cathodically biased to reduce the ions and concurrently deposit tin and bismuth metal onto the bond pads. Alternately, tin and bismuth can be separately electrodeposited as layers on the bond pads and the bond pad heated to interdiffuse the metals to form the desired low-temperature alloy. Alternate means of coating bond pad 18 with plate 16 include electroless plating, evaporation, and sputtering. Deposition is carried out to produce plate 16 having a thickness at least sufficient to provide a continuous coating and preferably not greater than 50 µm. The substance of plate 16 is such that the solder bump produced by the fusing of plate 16 with microdroplet 14 produces a solder bump having a preferred composition and desired metallurgical properties.

FIG. 2 shows a solder bump 24 formed on faying surface 19 following impact of the microdroplet onto the plate. Upon contact, the molten solder microdroplet releases heat to locally melt the plate. In this manner, the microdroplet and the plate fuse to form solder bump 24. The resulting solder bump is thus formed of an alloy composed of the alloys of the plate and the microdroplet. Thus, upon solidification, the composition of the plate is uniformly alloyed within the solidifying microdroplet to form solder bump 24.

It is a feature of the present invention that additional microdroplets can be deposited onto solder bump 24 to increase the amount of solder to a desired amount for forming a connection. Each succeeding microdroplet fuses to the solder bump formed by the previous droplet. The contents of the solder bump further diffuse into the additional microdroplets. Thus, the depositing of additional microdroplets increases the size and structural integrity of the solder bump.

In accordance with a preferred embodiment, the present invention provides a method for forming a solder bump by depositing micro volumes of solder in the form of discrete microdroplets. The solder bump is tightly bonded to the bond pad due to the intimate contact of the plate with the bond pad. In accordance with this invention, this is accomplished by pre-coating a metal plate onto the bond pad. The plate has a melting temperature less than the melting temperature of the solder. Common solder is formed of tin- or lead-base alloys having a melting temperature greater than about 160° C. It is also a feature of the present invention that the solder can be heated to a temperature higher than its melting point, a process known as superheating. This assists in assuring proper melting of the plate to which the solder is deposited. In the described embodiment, the solder is deposited onto a plate of tin-indium alloy. Suitable plates include alloys having a melting temperature of less than about 160° C. Suitable plates may be composed of indium metal and have a melting temperature of about 158° C., or may be composed of a tin-bismuth alloy having a composition of between about 55 and 65 weight percent bismuth and the balance substantially tin, preferably a eutectic composition composed of about 58 weight percent bismuth and the balance substantially tin and having a melting temperature of about 138° C.

It is a key feature of this invention that the melting temperature of the plate is lower than the temperature of the molten microdroplet. This feature allows the residual heat of the microdroplet at impact to at least locally melt the plate and thereby fuse the microdroplet to the plate to form a solder bump. In the process, at least some of the plate diffuses with the solder of the microdroplet. Preferably, the resulting bump has a uniform composition, but the invention can work with compositions having non-uniform compositions, due to later reflow of the device, which so heats the bond pad as to diffuse the contents of the solder bump with those of the bond pad. The amounts of the components should be tailored to produce desired metallurgical properties in the solder bump connection.

The present invention allows solder microdroplets to form uniform deposits onto bond pads due to the fusion of the microdroplets with the plate. Tight bonding is attributed to good adhesion of the plate as the result of the method in which the plate is coated on the bond pad. It is a further benefit of the present invention that the step of adding flux to the bond pad in order to allow wetting to occur is not necessary, as the plate covering the bond pad prevents oxidation of the bond pad from occurring, thereby facilitating wetting. This invention allows for the tailoring of solder bump alloy compositions across a substrate through the diffusional alloying that takes place between the low temperature plate and the molten solder alloy. The plate and the solder should be selected from metals which can be alloyed to form a diffuse, consistent alloy.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for forming a solder bump bonded to a bond pad on a substrate, said bond pad having a copper faying surface, said method comprising:

coating the copper faying surface with a plate formed of a first metal having a first melting temperature;

projecting a discrete microdroplet onto the plate, said microdroplet being formed of a molten second metal having a second melting temperature greater than the first melting temperature and fusible to the first metal to form a solder alloy, said microdroplet being projected onto the plate so as to fuse the microdroplet to the plate to form the solder bump.

2. The method of claim 1, wherein the first melting temperature is less than 160° C.

3. The method of claim 1, wherein the first melting temperature is not greater than about 120° C.

4. The method of claim 1, wherein the second melting temperature is at least 160° C.

5. The method of claim 1, wherein the second melting temperature is greater than 180° C.

6. The method of claim 1, wherein the step of projecting is comprised of jetting said microdroplet from a solder-jet device.

7. The method of claim 1, wherein the plate is composed of metal selected from the group consisting of indium, indium-base alloys, and tin-bismuth alloys.

8. The method of claim 1, wherein the microdroplet is composed of a molten solder selected from the group consisting of tin-base solders and lead-base solders.

9. The method of claim 1, wherein the solder bump is composed of an alloy comprising the second metal selected from the group consisting of tin-base and lead-base solders and the first metal selected from the group consisting of indium, indium-base alloy, and tin-bismuth alloy of said plate and is characterized by a substantially uniform composition.

10. The method of claim 1, further comprising projecting a second discrete microdroplet of the molten second metal onto said solder bump to fuse the second discrete microdroplet to said solder bump.

11. A method for forming a solder bump on a substrate, said substrate comprising a bond pad having a faying surface composed of solder-wettable metal, said method comprising:

coating the faying surface with a plate composed of metal selected from the group consisting of indium, indium-base alloys, and tin-bismuth alloys; and projecting a discrete microdroplet of a molten metal selected from the group consisting of tin-base metals and lead-base metals onto the plate to fuse the microdroplet to the plate and thereby form the solder bump.

12. The method of claim 11, wherein the plate is formed of an alloy composed of between about 35 and 45 weight percent tin and the balance substantially bismuth.

13. The method of claim 11, wherein the microdroplet has a diameter between about 25 and 50 μm.

14. The method of claim 11, wherein the plate has a thickness of less than 50 μm.

15. The method of claim 11, wherein the molten metal is composed of a molten tin-base solder.

16. The method of claim 15, wherein the tin-base solder is formed of an alloy composed substantially of tin and lead.

17. The method of claim 16, wherein the tin-base solder is formed of an alloy composed of between about 55 to 65 weight percent tin and the balance substantially lead.

18. The method of claim 11, wherein the molten metal is composed of a molten lead-base solder.

19. The method of claim 18, wherein the lead-base solder is formed of an alloy composed of about 95 weight percent lead and the balance substantially tin.

20. The method of claim 11, wherein the plate is formed of an alloy composed substantially of tin and indium.

21. The method of claim 20, wherein the plate is formed of an alloy composed of between about 15 to 60 weight percent tin and the balance substantially indium.

22. A method for forming a solder bump bonded to a bond pad on a substrate, said bond pad having a copper faying surface, said method comprising:

coating the copper faying surface with a tin-indium plate having a melting temperature of less than about 120° C.; and solder-jetting a discrete microdroplet of a molten tin-lead solder having a diameter between about 25 and 50 μm and a melting temperature greater than about 180° C., whereupon the discrete microdroplet fuses to the tin-indium plate to form the solder bump, wherein the solder bump is characterized by a substantially uniform tin-lead-indium composition.

* * * * *